United States Patent
Sumino

(10) Patent No.: US 9,691,820 B2
(45) Date of Patent: Jun. 27, 2017

(54) BLOCK ARCHITECTURE FOR VERTICAL MEMORY ARRAY

(71) Applicant: Sony Semiconductor Solutions Corporation, Kanagawa (JP)

(72) Inventor: Jun Sumino, Boise, ID (US)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 14/695,830

(22) Filed: Apr. 24, 2015

(65) Prior Publication Data

US 2016/0315120 A1    Oct. 27, 2016

(51) Int. Cl.

| | | |
|---|---|---|
| H01L 27/24 | (2006.01) | |
| H01L 27/115 | (2006.01) | |
| H01L 27/11524 | (2017.01) | |
| H01L 27/11548 | (2017.01) | |
| H01L 27/11556 | (2017.01) | |
| H01L 27/1157 | (2017.01) | |
| H01L 27/11575 | (2017.01) | |
| H01L 27/11582 | (2017.01) | |
| H01L 23/528 | (2006.01) | |

(52) U.S. Cl.
CPC ........ H01L 27/2481 (2013.01); H01L 23/528 (2013.01); H01L 27/1157 (2013.01); H01L 27/11524 (2013.01); H01L 27/11548 (2013.01); H01L 27/11556 (2013.01); H01L 27/11575 (2013.01); H01L 27/11582 (2013.01)

(58) Field of Classification Search
CPC ......... H01L 27/11548; H01L 27/11551; H01L 27/11556; H01L 27/11575; H01L 27/11578; H01L 27/11582; H01L 27/2481; H01L 27/249
See application file for complete search history.

(56) References Cited

U.S. PATENT DOCUMENTS

| | | | | |
|---|---|---|---|---|
| 7,211,885 B2* | 5/2007 | Nordal | ..................... | H01L 24/24 257/686 |
| 7,821,058 B2* | 10/2010 | Kidoh | ............... | H01L 27/11568 257/324 |
| 7,920,408 B2* | 4/2011 | Azuma | .............. | G11C 13/0007 365/148 |
| 8,471,297 B2* | 6/2013 | Murata | ............... | H01L 27/2409 257/211 |
| 2007/0132049 A1* | 6/2007 | Stipe | .................. | G11C 13/0007 257/421 |
| 2011/0065272 A1* | 3/2011 | Mizukami | ........... | H01L 23/5226 438/637 |

* cited by examiner

*Primary Examiner* — Allison P Bernstein
(74) *Attorney, Agent, or Firm* — Sheridan Ross P.C.

(57) ABSTRACT

Three-dimensional memory structures that are configured to use area efficiently, and methods for providing three-dimensional memory structures that use area efficiently are provided. The vertical memory structure can include a number of bit line bits that is greater than a number of word line bits. In addition, the ratio of bit line bits to word line bits can be equal to a ratio of a first side a memory cell included in a memory array of the memory structure to a dimension of a second side of the memory cell.

17 Claims, 8 Drawing Sheets

BLOCK ARCHITECTURE FOR VERTICAL MEMORY ARRAY

FIELD

The present disclosure relates to a block architecture for vertical memory arrays, and in particular to improving the area efficiency of memory arrays.

BACKGROUND

Memory devices are used in a wide range of fields. For example, solid-state memory can be used for long or short term storage of program instructions and data in connection with computing devices. Memory density, access speed, and reliability are all important considerations in designing solid-state memory. Recent solid-state memory designs have used three-dimensional architectures. Such designs can increase memory density. In addition, such designs are well suited for use in connection with resistive random access memory (ReRAM), phase change random access memory (PCRAM), and phase change random access memory (PRAM).

In a three-dimensional (3D) memory structure, signal lines, including bit lines (BL) and word lines (WL), extend between socket regions on a periphery of the memory structure, and the memory array itself. More particularly, a first socket region on a first side of the memory array can include electrodes or contacts associated with the bit lines, and a second socket region on a second side of the memory array can include electrodes or contacts associated with the word lines. In other configurations, socket regions on first and second opposing sides of the memory array can be associated with bit lines, and socket regions on third and fourth opposing sides of the memory array can be associated with word lines. As the number of memory cells included in the memory array is increased, there is a corresponding increase in the number of signal lines (i.e. bit lines and/or word lines). In addition, due to physical constraints in the size of the bit lines and word lines, the area of the memory structure occupied by the socket regions becomes increasingly large as compared to an area of the memory array. This problem is exacerbated by decreases in the size of memory cells and in the size of memory cell pitch, and increases in the density of the memory array. The area of the memory structure occupied by socket regions also increases relative to the area of the memory structure occupied by the memory array as the number of decks or layers within the memory structure increases. Moreover, the complicated three-dimensional structure of such memories makes individual memory cells difficult to access. Because of such problems, decreases in the overall size of memory structures have not kept pace with decreases in the size of memory arrays themselves, and costs associated with providing three-dimensional memory structures have remained relatively high.

SUMMARY

In three-dimensional memory structures, memory cells can be densely packed within the memory array. However, as the number of memory cells within a given area increases, the proportion of the overall area of the memory structure that is occupied by socket regions, rather than by memory cells, increases.

Embodiments of the present disclosure provide for three-dimensional memory structures that are configured to efficiently provide connections to memory cells within the memory array. In a solid state memory device, individual memory cells are accessed by selectively energizing bit lines and word lines. Bit lines and word lines are accessed through the bit line socket region or regions and word line socket region or regions respectively. For a given wiring dimension, as the number of bit lines and word lines increases, the area of the bit line socket region or word line socket region also increases. Memory structures in accordance with embodiments of the present disclosure provide for improved or optimized allocations of total memory area between a memory array area or region and socket regions. As set forth herein, through selective allocation of the number of bit line bits and the number of word line bits, the overall area of a memory structure can be optimized. In particular, the proportion of the total area of a memory structure occupied by the bit line and word line socket regions relative to the area occupied by the memory array region can be reduced or minimized.

In accordance with embodiments of the present disclosure, a number of bit line bits m is greater than a number of word line bits n (m/n>1). In accordance with further embodiments of the present disclosure, the ratio of word line bits to bit line bits is 1:2. In accordance with still further embodiments of the present disclosure, the ratio x/y of memory cell areas within the memory array, where x is a dimension along a side of the memory cell that is parallel to a side of the memory array along which the word line socket region is disposed, and where y is a dimension along a side of the memory cell that is parallel to a side of the memory array along which the bit line socket region is disposed, is about equal to the ratio given by the number of word line bits n to the number of bit line bits m.

In accordance with embodiments of the present disclosure, block architectures for vertical memory arrays are provided. More particularly, block architectures that provide for an area efficient memory structure are disclosed. In accordance with at least some embodiments of the present disclosure, a three-dimensional memory structure is provided in the form of a vertical memory structure having a plurality of bit line bits and a plurality of word line bits. The number of bit line bits is greater than the number of word line bits. In accordance with further embodiments, the number of bit line bits is at least four times the number of word line bits. In accordance with still other embodiments, the number of bit line bits is exactly four times the number of word line bits.

In accordance with still other embodiments of the present disclosure, a cross-point type memory structure is provided. In such embodiments, the number of bit line bits can be equal to the number of word line bits. According to an embodiment of the present disclosure, a three-dimensional memory structure is provided that includes a plurality of conductive lines, and a first socket region. The structure also includes a memory array area, wherein the conductive lines included in the first plurality of conductive lines extend from the memory array area to the first socket region. In addition, the structure includes a second plurality of conductive lines and a second socket region. The conductive lines included in the second plurality of conductive lines extend from the memory array area to the second socket region. In addition, the first socket region extends along a first side of the memory array area, while the second socket region extends along a second side of the memory array area. Moreover, a number of conductive lines in the first plurality of conductive lines within the first socket region is equal to m, and the number of conductive lines in the second plurality of conductive lines in the second socket region is equal to n, wherein m is equal to n.

According to still another embodiment of the present disclosure, a three-dimensional memory structure is provided that includes a memory array with a plurality of memory cells. The memory array occupies a first area that extends in first and second directions. Each memory cell occupies an area that extends for a first length y in the first direction and a second length x in the second direction. Each memory cell is contained within the memory array area. A bit line socket region extends in the first direction along a first side of the memory array. A number of bit lines extend between the memory array area and the bit line socket region. Within the bit line socket region, the number of bit line bits is equal to m. A word line socket region extends in the second direction along a second side of the memory array area. A number of word lines are provided, wherein the word lines extend between the memory array area and the word socket region, and wherein within the word line socket region a number of word line bits is equal to n. Moreover, x/y=n/m.

In accordance with still other embodiments of the present disclosure, a method for configuring a three-dimensional memory structure is provided. The method includes providing a three-dimensional memory array. In addition, the method includes providing a first socket region along a first side of the three dimensional memory array and providing a second socket region along a second side of the three-dimensional memory array. A plurality of bit lines are provided that connect at least one memory cell within the three-dimensional memory array to a bit line bit that extends to the first socket region. In addition, the method includes providing a plurality of word lines that extend between at least one memory cell within three-dimensional memory array and the second socket region. Moreover, the number of bit line bits (m) is greater than the number of word line bits (n).

Additional features and advantages of embodiments of the present disclosure will become more readily apparent from the following description, particularly when taken together with the accompanying drawings.

DETAILED DESCRIPTION

Figure 1:
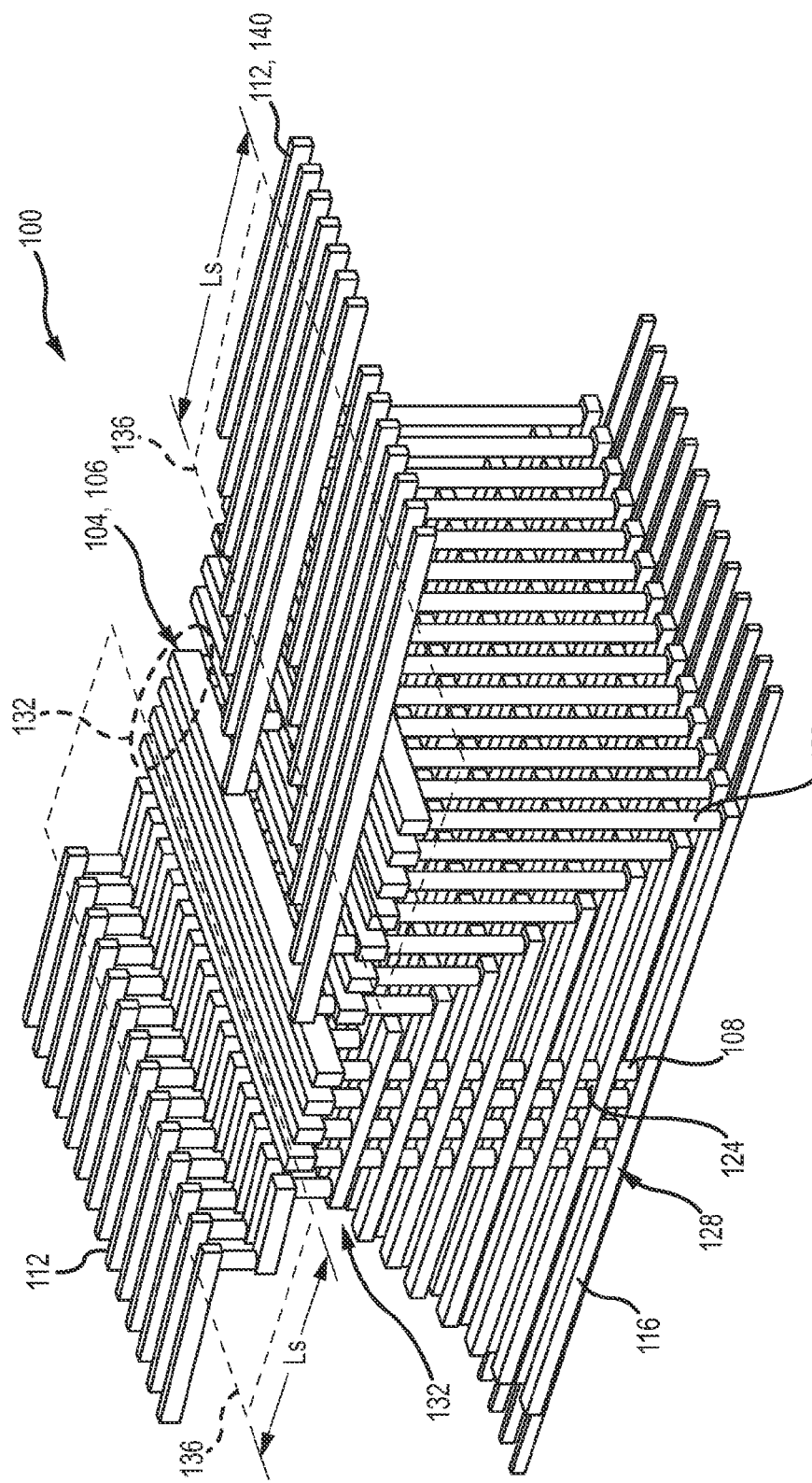
FIG. 1 is a perspective view of a three-dimensional memory structure in accordance with the prior art.

FIG. 1 depicts a three-dimensional memory structure 100, such as may be found in the prior art. More particularly, a three-dimensional memory structure 100 in the form of a vertical memory array is depicted. The memory structure 100 includes a plurality of bit lines 104 that are electrically connected to the ends of vertical memory elements 108. The memory structure 100 also includes a plurality of word lines 112 that are connected to horizontal electrodes 116, either directly or through a connecting conductor 120. Memory cells 124 are formed in areas of the vertical memory elements 108 that are adjacent a horizontal electrode 116, and are generally contained within a memory array area 128 of the memory structure. In the example memory structure 100, bit lines 104 extend such that they can be accessed within bit line socket regions 132 adjacent two opposite sides of the memory array area 128. The number of bit line contacts or bits 106 that can be accessed within the bit line socket region 132 is, in this example, equal to the number of bit lines 104. Similarly, word lines 112 extend such that they can be accessed within word line socket regions 136 adjacent two opposite sides of the memory array area 128. The number of word line contacts or bits 140 that can be accessed within the word line socket region 136 is, in this example, equal to the number of bit lines 112. As the number of memory cells 124 within the memory structure 100 increases, the number of bit lines 108 and/or word lines 112 also increases. In this example, the number of word lines 112 is much greater than the number of bit lines 104, which generally supports a high density memory array area 128, by allowing for an increased number of horizontal electrodes or decks 116. Accordingly, this configuration, which features more word line bits 140 than bit line bits 106, is considered to be a desirable design in the prior art. Moreover, while a three-dimensional memory structure, such as the example prior art memory structure 100, has memory cells 124 disposed in three-dimensions, the bit line 132 and word line 136 socket regions require a certain amount of area within a plane parallel to the horizontal electrodes 116 in which to complete the connections. The result is that, as the number of memory cells 124 increases, and in particular as the number of horizontal electrodes or decks 116 increases, the proportion of the total area of the memory structure occupied by the bit line 132 and word line 136 socket regions becomes increasingly large.

Figure 2:
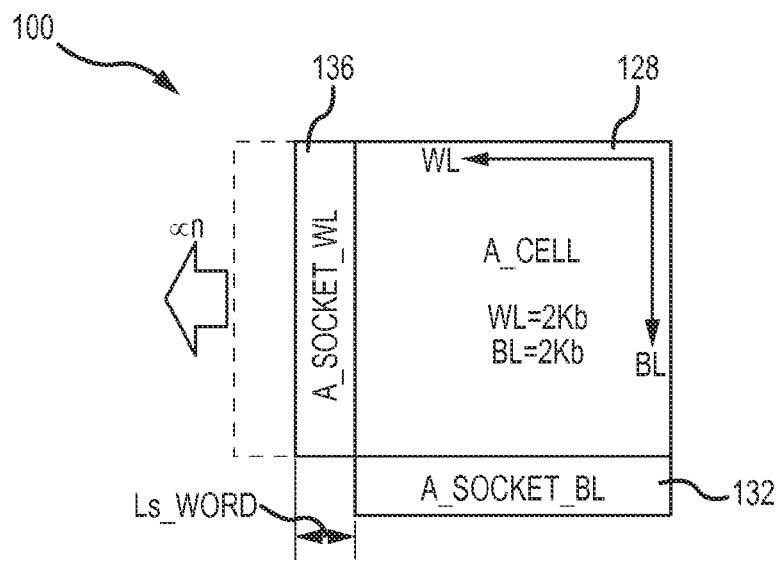
FIG. 2 depicts areas of the three dimensional memory structure of FIG. 1 in plan view.
Figure 5:
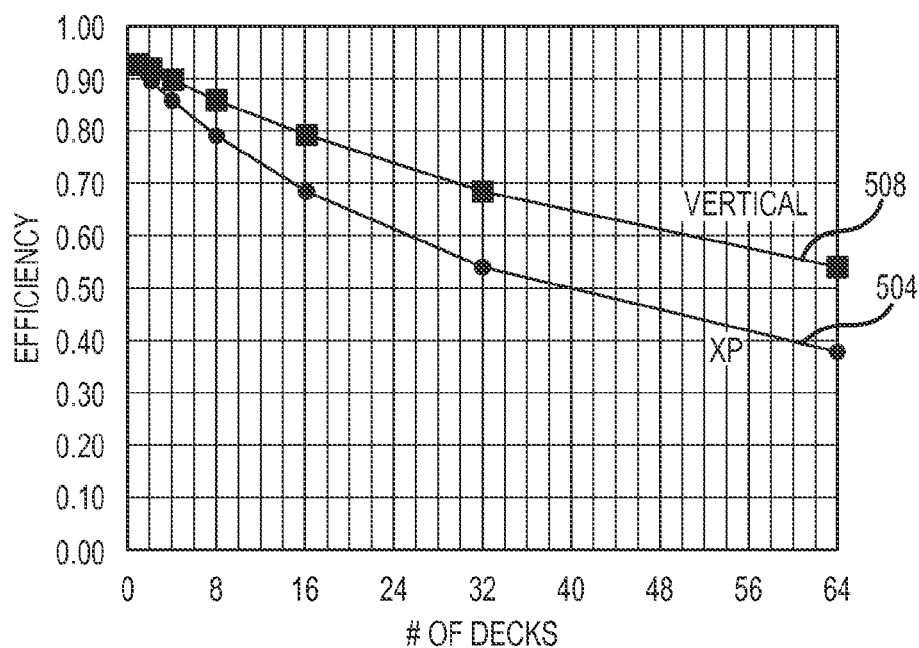
FIG. 5 is a graph depicting the area efficiency of example three-dimensional memory structures.

The area efficiency of a memory structure is, in accordance with embodiments of the present disclosure, given by the following expression:

$$Eff = \frac{A_c}{(A_c + A_s)}$$

where Eff is the area efficiency of the memory structure, $A_c$ is the area of the memory cell area, and $A_s$ is the total area of the bit line and word line socket regions. As depicted in FIG. 2, the length $L_{s\_word}$ of the word line socket region 136 increases as the number of horizontal electrodes 116 increases, in order to provide the contacts 140 and/or the connecting conductors 120 access to the horizontal electrodes 116, which are typically disposed in a staircase contact arrangement. As the number of decks or horizontal electrodes 116 is increased, the area density of the memory array 128 increases, and the area occupied by the word line socket region or regions 136 also increases. In addition, for a given socket region 132, 136 arrangement, the overall area of a memory structure 100 occupied by the socket regions 132, 136 becomes increasingly large as the number of decks 116, and thus the number of memory cells 124 within a given memory cell area 128, increases. Moreover, the area occupied by the socket regions 132, 136 becomes an increasingly large proportion of the total area of the memory structure 100 as the density of the memory cell area 128 is increased. As can be appreciated by one of skill in the art after consideration of the present disclosure, the decrease in area efficiency occurs regardless of the number of socket regions 132, 136 included in the vertical memory structure. This decrease in area efficiency is shown in FIG. 5, which is a graph showing how the area efficiency of both cross-point (XP) (plot 504) and vertical (plot 508) type three-dimensional memory structures decreases as the number of horizontal electrodes or decks 116 increases for a given set of parameters, such as but not limited to the memory cell 124 spacing.

Figure 3:
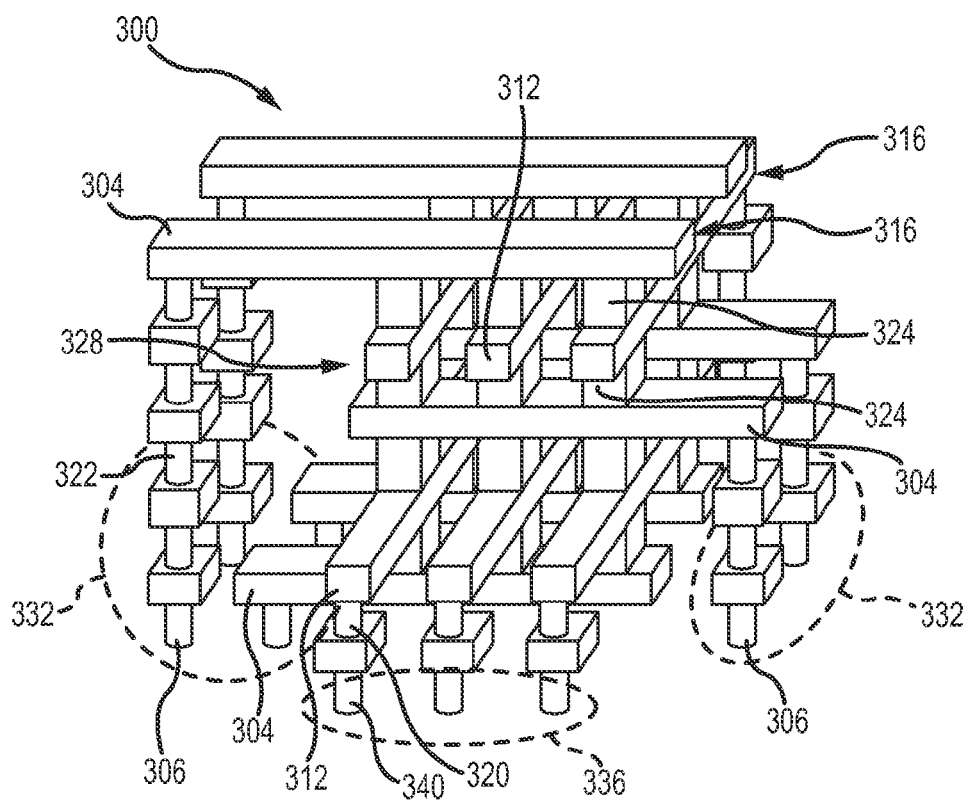
FIG. 3 is a perspective view of another three-dimensional memory structure in accordance with the prior art.

FIG. 3 illustrates a three-dimensional memory structure 300, and in particular is an example of a cross-point type memory structure in accordance with the prior art. The memory structure 300 includes a plurality of bit lines 304 and a plurality of word lines 312. In general, the bit lines 304 and word lines 312 are arranged such that they intersect one another when the memory structure 300 is considered in plan view. For example, the bit lines 304 and word lines 312 are arranged such that they are substantially perpendicular to one another, at least within a memory array area 328 of the memory structure 300. Moreover, the bit lines 304 and word lines 312 are arranged in alternating decks or layers 316, when the memory structure 300 is considered in elevation. Memory cells 324 are formed in areas between intersecting bit lines 304 and word lines 312. In the example memory structure 300 depicted in FIG. 3, the bit lines 304 are electrically connected to bit line bits or contacts 306, for example through connecting conductors 322, that can be accessed within bit line socket regions 332 adjacent two opposite sides of the memory array area 328. The word lines 312 are electrically connected to contacts 340, either directly or through connecting conductors 320 such that they electrically extend to word line socket regions 336 adjacent two other opposite sides of the memory array area 328 (note that the second word line socket region 336 is not visible in FIG. 3, as it is behind the memory array area 328). Moreover, the sides of the memory array area 328 adjacent to which the bit line socket regions 332 are formed are at an angle of approximately 90° with respect to the sides of the memory array area 328 adjacent to which the word line socket regions 336 are formed. As can be appreciated by one of skill in the art after consideration of the present disclosure, a selected memory cell 324 can be accessed using the bit line 304 and word line 312 on opposite sides of the selected memory cell 324. In this example from the prior art, the XP memory structure 300 includes a number of bit line bits 306 that differs from the number of word line bits 340.

Figure 4:
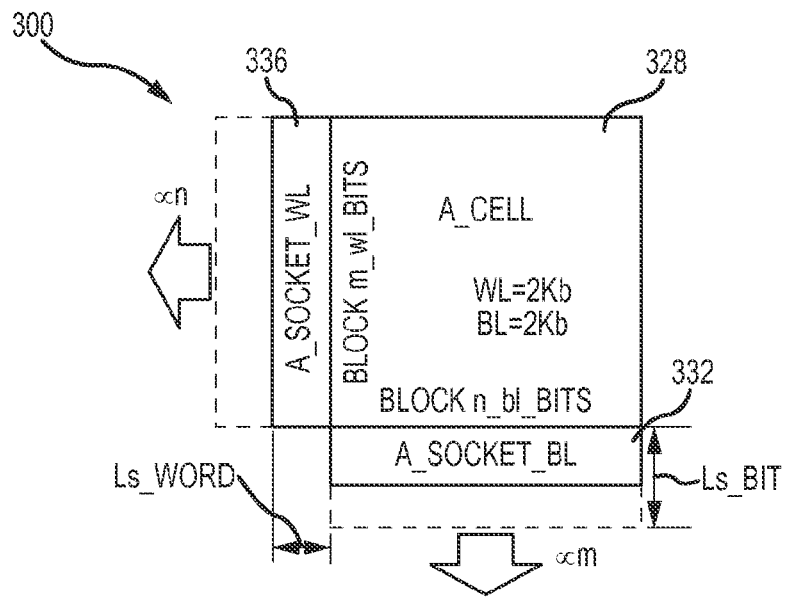
FIG. 4 depicts areas of the three dimensional memory structure of FIG. 3 in plan view.

FIG. 4 depicts different areas of the three-dimensional memory structure 300 of FIG. 3 in top plan view. In particular, the central area corresponds to the memory array area 328. The bit line 332 and word line 336 socket regions are shown disposed around the sides of the memory array area 328. In general, with a cross-point type memory structure, the length of $L_{s\_bit}$ of the bit line socket region 332 and the length $L_{s\_word}$ of the word line socket region 336 both increase as the number of decks 336 of the memory structure 300 increases, in order to provide access to the bit line 304 and the word line 312 electrodes. Accordingly, the overall area of the memory structure 300 occupied by the socket regions 332, 336 becomes increasingly large as the number of decks 316, and thus the density of the memory cells 324 within the memory array area 328 increases. Moreover, the area occupied by the socket regions 332, 336 becomes an increasingly large proportion of the total area of the memory structure 300 as the density of the memory cell area 328 is increased. As can be appreciated by one of skill in the art after consideration of the present disclosure, the decrease in area efficiency occurs regardless of the number of socket regions 332, 336 included in the cross-point memory structure. This decrease in area efficiency with increasing number of decks 116 is illustrated in FIG. 5.

Figure 6:
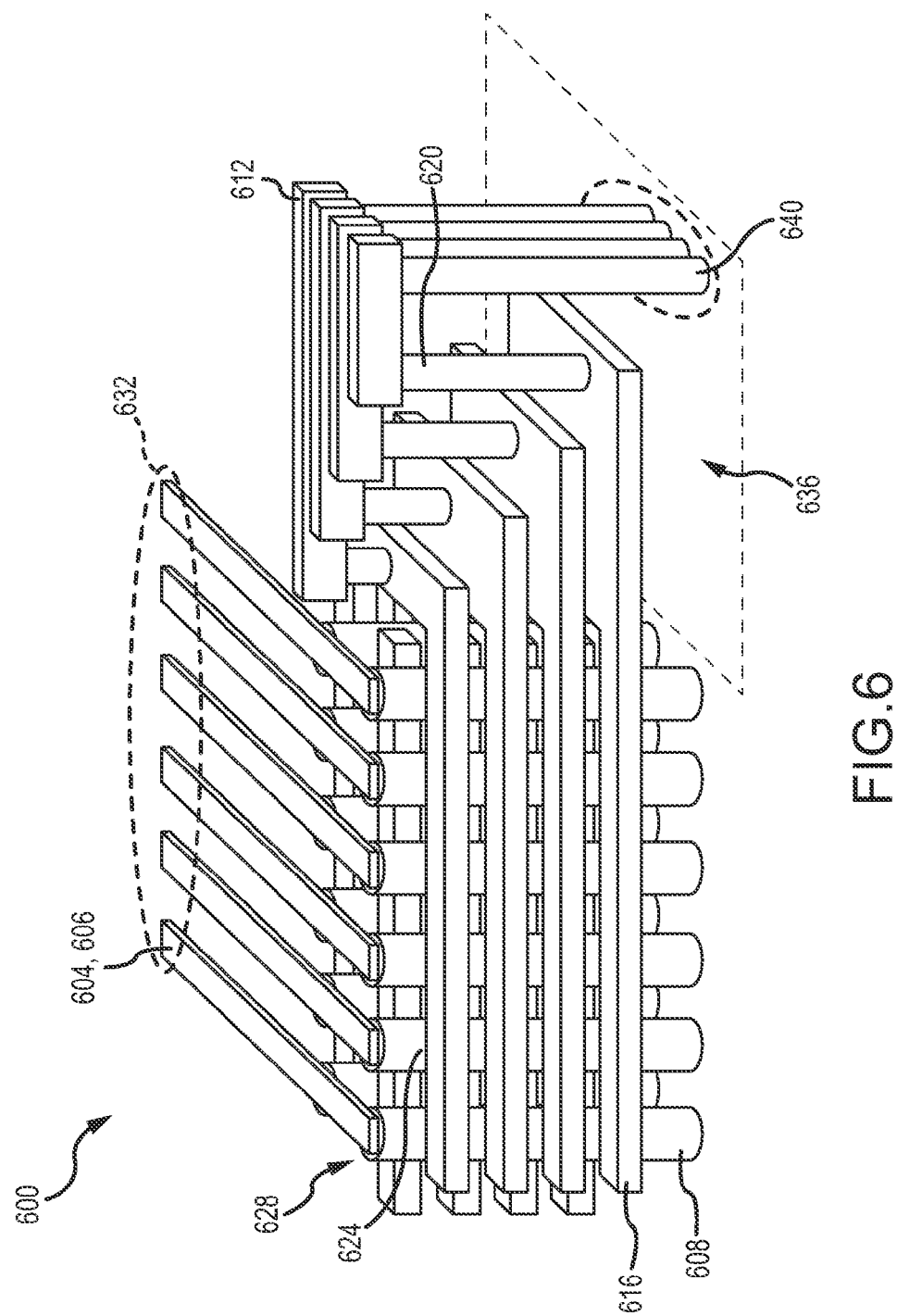
FIG. 6 is a perspective view of a vertical memory structure in accordance with embodiments of the present disclosure.

FIG. 6 illustrates a three-dimensional memory structure 600, and in particular is an example of a vertical memory array type memory structure in accordance with embodiments of the present disclosure. The memory structure 600 includes a plurality of electrically conductive bit lines 604 that are electrically connected to a plurality of vertical electrodes or memory elements 608. The memory structure 600 also includes a plurality of electrically conductive word lines 612 that are connected to horizontal electrodes or decks 616 either directly or through a connecting conductor 620. Memory cells 624 are formed in areas of the vertical electrodes 608 adjacent a horizontal electrode 616. Accordingly, the memory array area 628 extends in three dimensions. The bit lines 604 extend to contacts or bits 606 within a bit line socket region 632. In this example, the number of bit line bits 606 ($m$) is equal to the number of bit lines 604. The word lines 612, or interconnected word line bit conductors and/or contact pads 640, or projections thereof, are generally within a word line socket region 636. Moreover, the word line socket region 636, as illustrated in FIG. 6, can comprise a staircase type contact region. In this example, the number of word line bits 640 ($n$) is equal to the number of word lines 612 and is also equal to the number of horizontal electrodes or decks 616. Also in this example, the bit lines 604 are substantially perpendicular to the word lines 612. Although, as depicted in FIG. 6, there is a single bit line socket region 632 and a single word line socket region 636, multiple (e.g., two) bit line socket regions 632 and/or multiple (e.g., two) word line socket regions 636 can be provided. In accordance with embodiments of the present disclosure, and as discussed elsewhere herein, the number of bit line bits 606 ($m$) in a vertical memory structure 600 is greater than the number of word line bits 640 ($n$), in order to provide improved area utilization efficiency.

Figure 7:
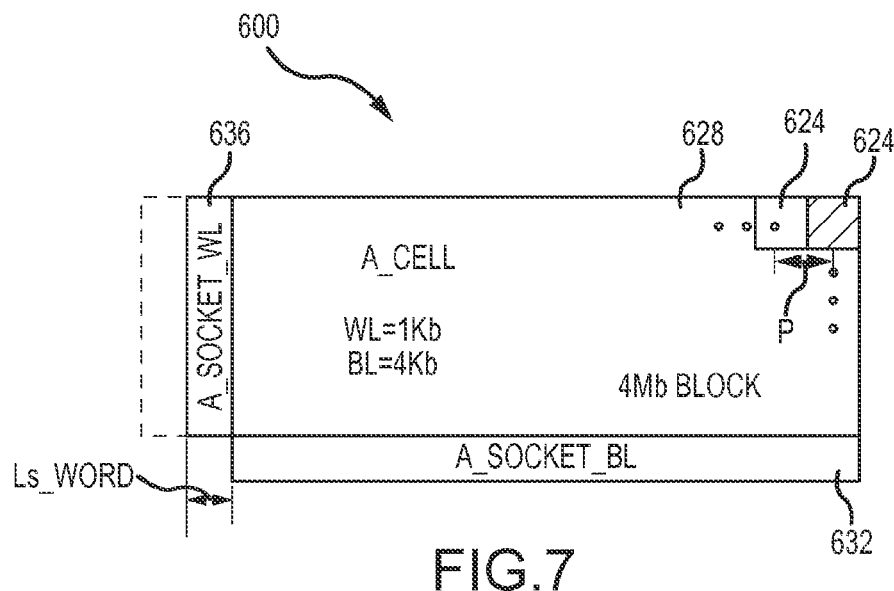
FIG. 7 depicts areas of the vertical memory structure of FIG. 6 in plan view.

FIG. 7 is a block diagram depicting the memory structure 600 of FIG. 6 in plan view. More particularly, FIG. 7 shows the relative areas occupied by the bit line socket region 632, the word line socket region 636, and the memory array area 628. As with a conventional vertical memory structure, the length $L_{s\_word}$ of the word line socket region 636 increases with the number of decks 616, however embodiments of the present disclosure provide improved area efficiency as compared to conventional arrangements.

In particular, for a vertical memory array 600, the socket length $L_{s\_word}$ of the word line socket region 636 can be expressed as follows:

$$L_{s\_word} = \{L_c + L_n \times n\} \times F$$

where $L_{s\_word}$ is the socket length, $L_c$ is a constant length factor, $L_n$ is a length factor that is dependent on the number of decks, F is the half pitch of the memory cell area, and n is the number of decks. Accordingly, it can be seen that the length (and thus the area) of the word line socket region 636, all other factors being equal, varies with the number n of decks 616 in the memory structure 600. The socket length $L_{s\_bit}$ of the bit line socket region 632 in the vertical memory structure 600 can be expressed as follows:

$$L_{s\_bit} = L_c \times F$$

Accordingly, the length (and thus the area) of the bit socket region 632 is not dependent on the number of decks 616. Instead, the length of the bit socket region 632 depends on design and process factors.

The area efficiency of a three-dimensional memory structure can be evaluated as the ratio of the area of the memory array to the area of the memory array plus the area of the socket regions. More particularly, as previously noted, the area efficiency can be expressed as follows:

$$Eff = \frac{A_c}{(A_c + A_{first\_socket\_region} + A_{second\_socket\_region})} = \frac{A_c}{(A_c + A_s)}$$

where Eff is the area efficiency of the memory structure, $A_c$ is the area of the memory cell area, $A_{first\_socket\_region}$ is the area of the first socket region, $A_{second\_socket\_region}$ is the area of the second socket region, and $A_s$ is the total area of the bit line and word line socket regions. For example, with reference to FIG. 7, the area efficiency is equal to the area of the memory array area 628 divided by the area equal to the memory array area 628 plus the area of the bit line socket region 632 plus the area of the word line socket region 636, where all of the areas are in a plane that is generally parallel to the horizontal electrodes or decks 116. Accordingly, where a socket region (e.g. socket region 636) encompasses a stair case contact region, the area of that socket region is taken from the projection of the region onto a horizontal plane.

Figure 8:
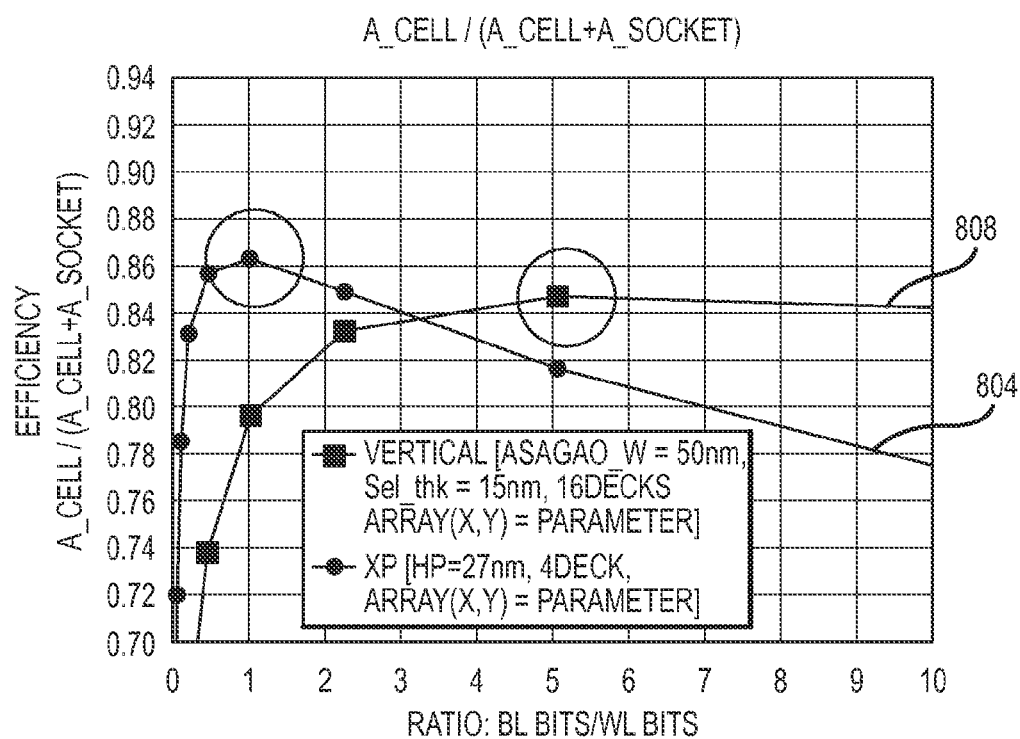
FIG. 8 is a graph depicting the area efficiency of example three-dimensional memory structures in accordance with embodiments of the present invention.

A vertical memory structure 600 in accordance with embodiments of the present disclosure has more bit line bits 606 than word line bits 640. This can be expressed as m/n>1, where m is the number of bit line bits and n is the number of word line bits. In accordance with still other embodiments of the present disclosure, the ratio of bit line bits 606 to word line bits 640 is greater than 1 and less than 6. In accordance with still other embodiments of the present disclosure, the ratio of bit line bits 606 to word line bits 640 for a vertical memory structure 600 is about 5, where about is ±5%. The relative area efficiency for an exemplary vertical memory structure 600 in accordance with embodiments of the present disclosure, and an example set of parameters, is depicted in FIG. 8, which shows that the area efficiency for the exemplary vertical memory structure 600 (plot 808) increases until the ratio of bit line bits 606 to word line bits 640 is slightly more than 5. More particularly, in this example, the vertical memory structure 600 was calculated using a constant length factor ($L_n$) of 150, a length factor dependent on the number of decks ($L_n$) equal to 50, a half pitch of a memory cell area equal to 27 nm, and the number of decks n equal to 16. In accordance with other embodiments of the present disclosure, the ratio of bit line bits 606 to word line bits 640 of a vertical memory structure is 4:1. For instance, as illustrated in Table 1, for a given set of dimensional parameters, a 4:1 ratio of bit line bits 606 to word line bits 640 offers a peak area efficiency value as compared to bit line bit to word line bit ratios of 0.25, 1, and 16.

TABLE 1

| No. of Bit Line bits (m) | No. of Word Line bits (n) | Ratio (m/n) | Array efficiency |
|---|---|---|---|
| 1024 | 4096 | 0.25 | 0.67 |
| 2048 | 2048 | 1 | 0.79 |
| 4096 | 1024 | 4 | 0.84 |
| 8192 | 512 | 16 | 0.83 |

Figure 9:
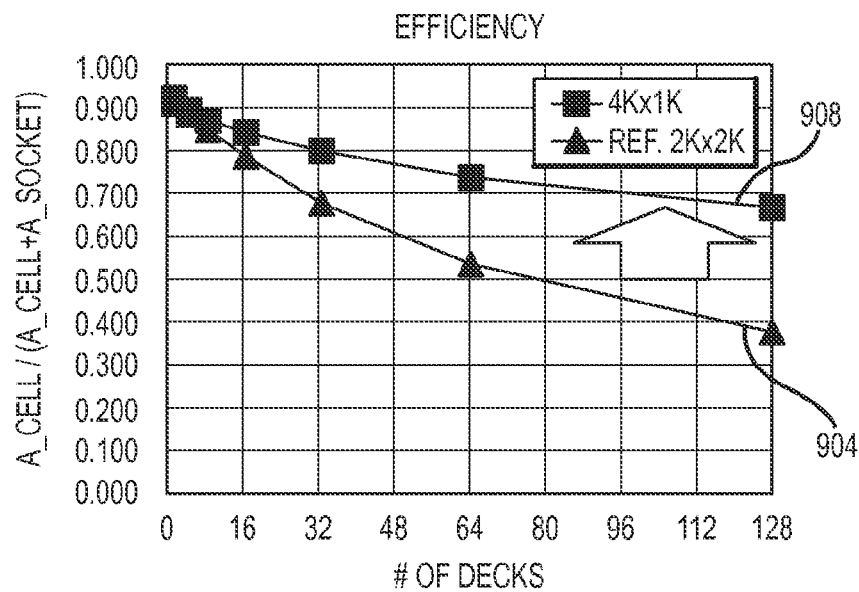
FIG. 9 is a graph depicting the area efficiency of an example three-dimensional memory structure in accordance with embodiments of the present invention as compared to the area efficiency of a reference three-dimensional memory structure.

In order to address the need for increased amounts of memory, the number of decks or layers within three-dimensional memory structures can be increased. However, the overall efficiency of the memory structure tends to decrease as the number of decks or layers increases. This effect was illustrated in FIG. 5, and results from the need to provide area within which to attach contacts to horizontal electrodes. As shown in FIG. 9, embodiments of the present disclosure can provide three-dimensional memory structures with improved area utilization efficiency. More particularly, FIG. 9 illustrates the comparative efficiencies of a reference vertical memory array structure having a number of bit line bits equal to a number of word line bits (plot 904), to a vertical memory structure 600 in accordance with embodiments of the present disclosure, with a bit line bit to word line bit ratio of 4:1 (plot 908), for different numbers of decks or layers. As shown by FIG. 9, the increase in efficiency provided by embodiments of the present disclosure increases with number of decks as compared to a memory structure with a number of bit line bits is equal to a number of word line bits.

Figure 10:
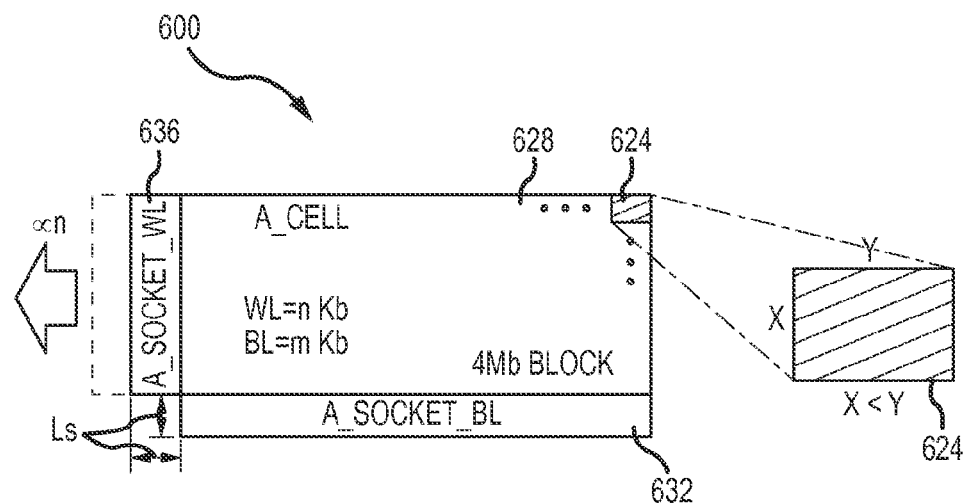
FIG. 10 depicts a block architecture for a vertical memory structure in accordance with further embodiments of the present disclosure in plan view.

FIG. 10 depicts a block architecture for a vertical memory structure 600 in accordance with further embodiments of the present disclosure in plan view. FIG. 10 is similar to FIG. 7, in that it shows the relative areas occupied by the bit line socket region 632, the word line socket region 636, and the memory array area 628. Also, the length $L_{s\_word}$ of the word line socket region 636 increases with the number of decks of the vertical memory structure 600. The embodiment depicted in FIG. 7 includes memory cells 624 that each occupy a square area within the memory array area 628. The embodiment depicted in FIG. 10 provides increased memory array area 628 efficiency as compared to the embodiment depicted in FIG. 7 by utilizing a rectangular area for the individual memory cells 624. This can be expressed as follows:

$$y > x$$

where x is the dimension of a memory cell 624 in a direction parallel to the side of the memory array area 628 adjacent the word line socket area 636, y is the dimension of the memory cell 624 in a direction parallel to the side of the memory array area 628 adjacent the bit line socket area 632.

More particularly, the ratio of the dimension of a memory cell 624 in a direction parallel to the side of the memory array area 628 to which the word line socket area 636 is adjacent to the dimension of the memory cell 624 in a direction parallel to the side of the memory array area 628 to which the bit line socket area 632 adjacent, is equal to the ratio of the number of word line bits 640 to the number of bit line bits 606. This can be expressed as follows:

$$\frac{x}{y} = \frac{n}{m}$$

where n is the number of word line bits 640, and m is the number of bit line bits 606.

Figure 11:
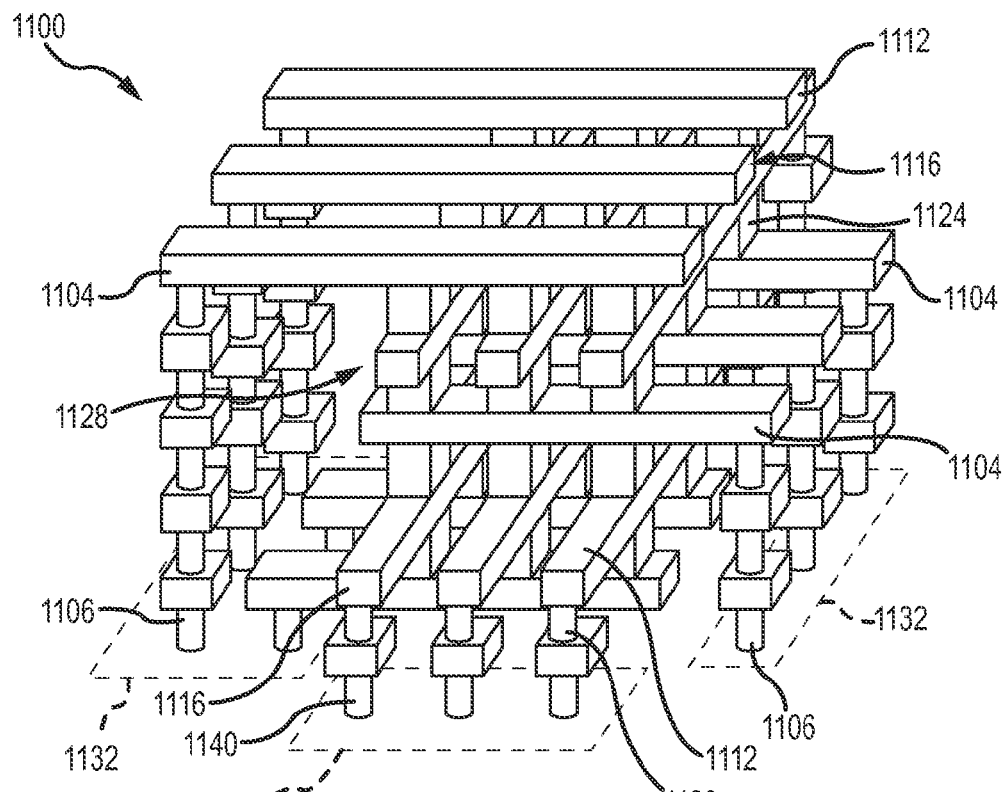
FIG. 11 is a perspective view of a cross-point memory structure in accordance with embodiments of the present disclosure.

FIG. 11 is a perspective view of a cross-point memory structure 1100 in accordance with embodiments of the present disclosure, in a perspective view. The memory structure 1100 includes a plurality of bit lines 1104 and a plurality of word lines 1112. In general, the bit lines 1104 and word lines 1112 are arranged such that they intersect one another when the memory structure 1100 is considered in plan view. Moreover, the bit lines number 1104 and word lines 1112 are arranged in alternating decks or layers 1116 when the memory structure is considered in elevation. Memory cells 1124 are formed in areas between intersecting bit lines 1104 and word lines 1112. The bit lines 1104 can be electrically connected to bit line bits or contacts 1106, for example through connecting conductors 1122, that can be accessed within bit line socket regions 1132 adjacent one or two sides of the memory array area 1128. The word lines 1112 are electrically connected to contacts 1140, either directly or through connecting conductors 1120 such that they electrically extend to word socket regions 1136 adjacent one or two sides of the memory array area 1128. A selected memory cell 1124 can be accessed using the bit line 1104 and word line 1112 on opposite sides of the selected memory cell 1124. Accordingly, a cross-point type memory structure 1100 in accordance with embodiments of the present disclosure may function similarly to a structure formed in accordance with the prior art. However, embodiments of the present disclosure provide for an equal number of bit line bits 1106 and word line bits 1140. In particular, as discussed elsewhere herein, a cross-point memory structure 1100 with an equal number of bit line bits 1106 and word line bits 1140 can provide for improved area utilization efficiency as compared to cross-point structures having a number of bit line bits that differs from the included number of word line bits. This is illustrated in FIG. 8, which includes a plot showing the area efficiency of a cross-point memory structure for different ratios of bit line bits to word line bits, and which shows a peak efficiency at a ratio of 1:1.

Figure 12:
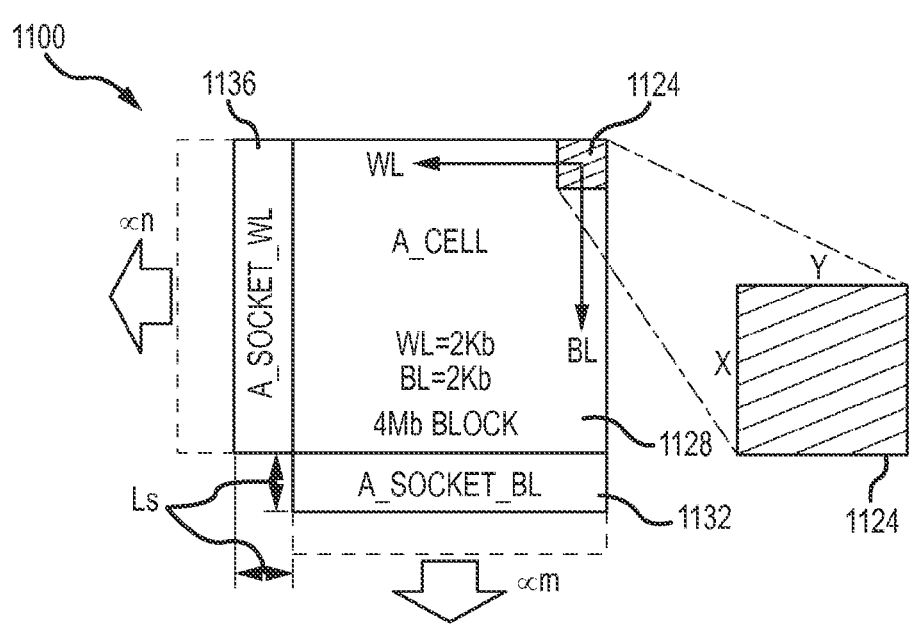
FIG. 12 depicts areas of the cross-point memory structure of FIG. 11 in plan view.

FIG. 12 is a block diagram depicting the memory structure 1100 of FIG. 11 in plan view. More particularly, FIG. 12 shows the relative areas occupied by the bit line socket region 1132, the word line socket region 1136, and the memory array area 1128. As shown, both the bit line socket region 632 and the word line socket region 636 areas increase with the number of bit line bits 1106 and word line bits 1140 respectively. As shown in FIG. 8, the maximum efficiency for a cross-point type memory structure 1100 (plot 804) is achieved where the number of bit line bits 1106 is equal to the number of word line bits 1140. Thus, a cross-point memory structure 1100 has an area utilization efficiency (Eff) that is maximized where m/n=1, where m is the number of bit line bits 1106, and where n is the number of word line bits 1140. FIG. 12 also shows the relative areas occupied by the bit line socket region 1132, the word line socket region 1136, and the memory array area 1128. As discussed elsewhere herein, a cross-point memory structure 1100 features optimized area efficiency, where area efficiency is a function of the proportion of the total area of the memory structure occupied by the socket regions 1132, 1136, when the number of bit line bits 1104 is equal to the number of word line bits 1112. In the embodiment illustrated in FIG. 12, the area of the individual memory array cells 1124 is set so that they are square, improving or maximizing the area efficiency of the memory array areas 1128. Accordingly, in an optimized cross-point memory structure, the ratio of the x and y dimensions of the individual memory cells 1124 is equal to the ratio of the number of word line bits 1140 to the number of bit line bits 1106, thus satisfying the expression x/y=n/m.

Figure 13:
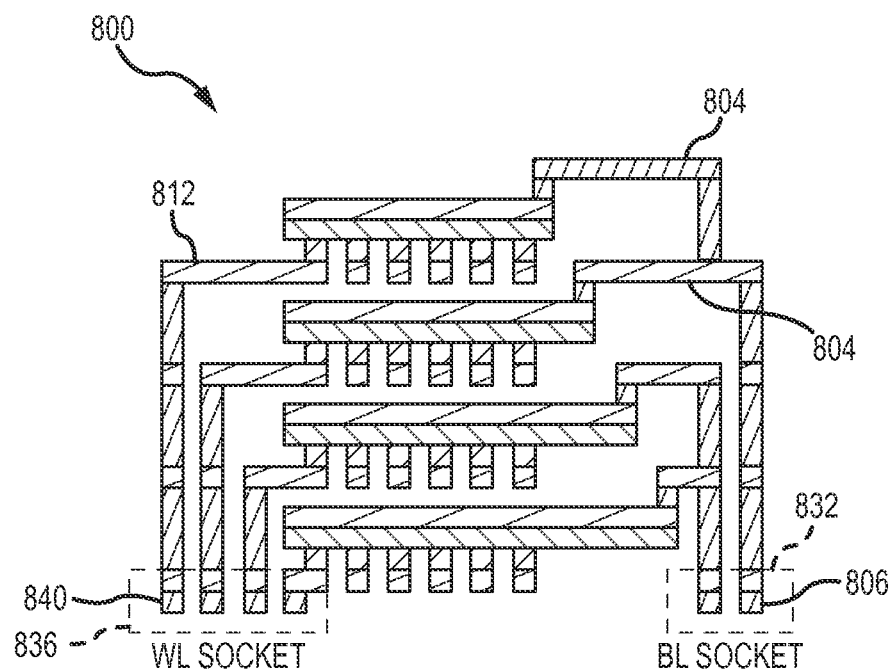
FIG. 13 depicts an alternate bit line arrangement for a cross-point memory structure such as may be used in accordance with embodiments of the present disclosure.

FIG. 13 depicts an alternate bit line 804 arrangement for a cross-point memory structure 800 such as may be used in accordance with embodiments of the present disclosure. More particularly, in this example, the number of bit line bits or contacts 806 included in the bit line socket region 832 is reduced as compared to the number of bit lines 804, by electrically connecting each bit line bit 806 to multiple bit lines 804. More particularly, in this example each bit line bit 806 is connected to two bit lines 804. In such embodiments, the length of the bit line socket region 832 is given by the following expression:

$$L_{s\_bit} = \{L_c + L_n \times 0.5n\} \times F$$

where $L_{s\_bit}$ is the socket length, $L_c$ is a constant length factor, $L_n$ is a length factor that is dependent on the number of decks, F is the half pitch of the memory cell area, and n is the number of decks. For such an embodiment, the area occupied by the word line socket region 836 is, as with other cross-point memory structure embodiments, dependent on the number of word line bits 840. Therefore, optimum efficiency of the cross-point memory structure 800 continues to be greatest where the number of word line bits 840 (m) is equal to the number of bit line bits 806 (n).

Figure 14:
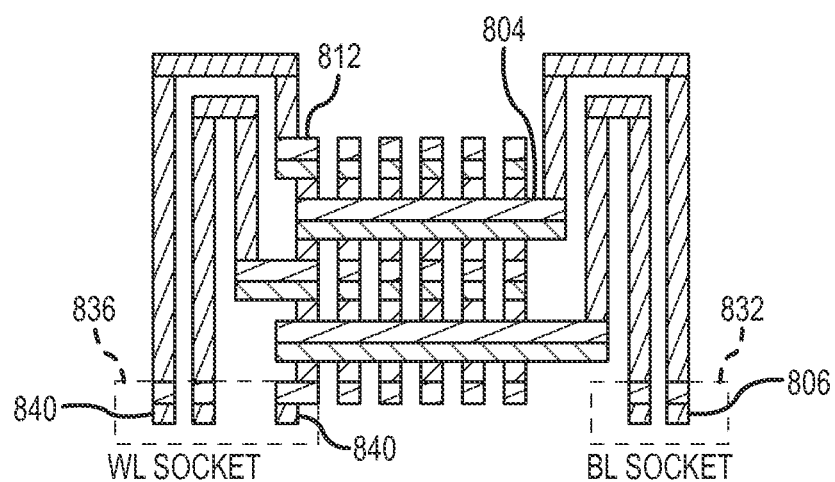
FIG. 14 depicts another alternate bit line arrangement for a cross-point memory structure such as may be used in accordance with embodiments of the present disclosure.

FIG. 14 depicts another alternate bit line 804 arrangement for a cross-point memory structure 800 such as may be applied in accordance with embodiments of the present disclosure. More particularly, in this example there are 3 word line bits 840 for every 2 bit line bits 806. In such embodiments, the length of the bit line socket region 832 is given by the following expression:

$$L_{s\_bit} = \{L_c + L_n \times n\} \times F$$

where $L_{s\_bit}$ is the socket length, $L_c$ is a constant length factor, $L_n$ is a length factor that is dependent on the number of decks, F is the half pitch of the memory cell area, and n is the number of decks. As in other embodiments, the area occupied by the word line socket region 836 is dependent on the number of word line bits 840. Therefore, optimum efficiency of the cross-point memory structure 800 is greatest where the number of word line bits 840 (m) is equal to the number of bit line bits 806 (n).

The foregoing discussion of the invention has been presented for purposes of illustration and description. Further, the description is not intended to limit the invention to the form disclosed herein. Consequently, variations and modifications commensurate with the above teachings, within the skill or knowledge of the relevant art, are within the scope of the present invention. The embodiments described hereinabove are further intended to explain the best mode presently known of practicing the invention and to enable others skilled in the art to utilize the invention in such or in other embodiments and with various modifications required by the particular application or use of the invention. It is intended that the appended claims be construed to include alternative embodiments to the extent permitted by the prior art.

What is claimed is:

1. A three dimensional memory structure, comprising:
a first plurality of conductive lines;
a first socket region;
a memory array area, wherein the conductive lines included in the first plurality of conductive lines extend from the memory array area to the first socket region;
a second plurality of conductive lines;
a second socket region, wherein the conductive lines included in the second plurality of conductive lines extend from the memory array area to the second socket region;
wherein the first socket region extends along a first side of the memory array area,
wherein the second socket region extends along a second side of the memory array area,
wherein at the first socket region a number of conductive lines in the first plurality of conductive lines is equal to m,
wherein at the second socket region a number of conductive lines in the second plurality of conductive lines is equal to n,
wherein m has a value that is at least twice a value of n,
wherein the memory array area includes a plurality of memory cells, and
wherein a length of the memory cells in a direction y parallel to the first side of the memory array area is greater than a length of the memory cells in a direction x parallel to the second side of the memory array area.

2. The three dimensional memory structure of claim 1, wherein a ratio x/y of a size of the memory cells in the direction parallel to the second side of the memory array area to a size of the memory cells in the direction parallel to the first side of the memory array area is equal to the ratio n/m of the number of conductive lines in the second socket region to the number of conductive lines in the first socket region.

3. The three dimensional memory structure of claim 2, wherein a length of the first socket region in a direction parallel to the first side of the memory array area is greater than a length of the second socket region in a direction parallel to the second side of the memory array area.

4. The three dimensional memory structure of claim 1, wherein the first plurality of conductive lines are bit lines (BL), wherein the second plurality of conductive lines are word lines (WL).

5. The three dimensional memory structure of claim 1, wherein the three dimensional memory structure is a vertical memory structure.

6. The three dimensional memory structure of claim 5, wherein the first plurality of conductive lines are bit lines (BL), and wherein the second plurality of conductive lines are word lines (WL).

7. The three dimensional memory structure of claim 5, wherein the first plurality of conductive lines are bit lines (BL), wherein the second plurality of conductive lines are word lines (WL), and wherein a ratio of the number of BL to the number of WL is at least 4:1.

8. The three dimensional memory structure of claim 5, wherein the first plurality of conductive lines are bit lines (BL), wherein the second plurality of conductive lines are word lines (WL), and wherein a ratio of the number of BL to the number of WL is 4:1.

9. The three dimensional memory structure of claim 1, wherein $A_c/(A_c+A_{first\_socket\_region}+A_{second\_socket\_region})>0.75$, where Ac is an area of the memory array area, $A_{first\_socket\_region}$ is an area of the first socket region, and $A_{second\_socket\_region}$ is an area of the second socket region.

10. The three dimensional memory structure of claim 1, wherein $A_{memory\_array}/(A_{memory\_array}+A_{first\_socket\_region}+A_{second\_socket\_region})>0.8$, where $A_{memory\_array}$ is an area of the memory array area, $A_{first\_socket\_region}$ is an area of the first socket region, and $A_{second\_socket\_region}$ is an area of the second socket region.

11. A three dimensional memory structure, comprising:
a memory array area, including a plurality of memory cells, wherein the memory array area occupies a first area that extends in first and second directions within at least a first plane, wherein each memory cell occupies an area that extends for a first length in the first direction and a second length in the second direction, wherein each memory cell is contained within the memory array area, wherein at least first and second memory cells in the plurality of memory cells are located within the first plane, and wherein the first length in the first direction is different from the second length in the second direction;
a bit line socket region, wherein the bit line socket region extends in the first direction along a first side of the memory array area;
a number of bit lines, wherein the bit lines extend between the memory array area and the bit line socket region, and wherein within the bit line socket region a number of bit line bits is equal to m;
a word line socket region, wherein the word line socket region extends in the second direction along a second side of the memory array area; and
a number of word lines, wherein the word lines extend between the memory array area and word line socket region, wherein the first length is y and the second length is x, wherein within the word line socket region a number of word line bits is equal to n, and wherein x/y=n/m.

12. The three dimensional memory structure of claim 11, wherein m/n>1.

13. The three dimensional memory structure of claim 11, wherein m is at least four times greater than n.

14. The three dimensional memory structure of claim 11, wherein m is four times greater than n.

15. The three dimensional memory structure of claim 11, wherein the three dimensional memory structure is a vertical memory structure.

16. The three dimensional memory structure of claim 11, wherein n is equal to a number of decks of the memory structure.

17. A method for configuring a three-dimensional memory structure, comprising:
providing a three dimensional memory array having a plurality of memory cells, wherein at least some of the memory cells occupy a first plane, wherein each memory cell occupies an area that extends for a first length in a first direction and a second length in a second direction, wherein the first direction and the second direction are parallel to the first plane, and wherein the first length in the first direction is different from the second length in the second direction;

providing a first socket region along a first side of the three dimensional memory array;

providing a plurality of bit lines, wherein each of the bit lines connects at least one memory cell within the three dimensional memory array to a bit line bit that extends to the first socket region;

providing a second socket region along a second side of the three dimensional memory array;

providing a plurality of word lines, wherein each of the word lines connects at least one memory cell within the three dimensional memory array to a word line bit that extends to the second socket region, wherein the number of bit line bits (m) is at least twice the number of word line bits (n).

* * * * *